(12) United States Patent
Chen et al.

(10) Patent No.: US 10,838,025 B2
(45) Date of Patent: Nov. 17, 2020

(54) RADIO-FREQUENCY SYSTEM FOR A MAGNETIC RESONANCE APPARATUS

(71) Applicant: Siemens Shenzhen Magnetic Resonance Ltd., Shenzhen (CN)

(72) Inventors: Yan Li Chen, Shenzhen (CN); Shu Du, Shenzhen (CN); Markus Vester, Nuremberg (DE); Jian Min Wang, Shenzhen (CN)

(73) Assignee: Siemens Healthcare GmbH, Erlangen (DE)

( * ) Notice: Subject to any disclaimer, the term of this patent is extended or adjusted under 35 U.S.C. 154(b) by 0 days.

(21) Appl. No.: 16/394,345

(22) Filed: Apr. 25, 2019

(65) Prior Publication Data

US 2019/0331745 A1 Oct. 31, 2019

(30) Foreign Application Priority Data

Apr. 25, 2018 (CN) .......................... 2018 1 0378684

(51) Int. Cl.
  *G01R 33/34* (2006.01)
  *G01R 33/3415* (2006.01)
  *G01R 33/36* (2006.01)
  *G01R 33/422* (2006.01)

(52) U.S. Cl.
  CPC ... *G01R 33/34076* (2013.01); *G01R 33/3415* (2013.01); *G01R 33/3628* (2013.01); *G01R 33/422* (2013.01)

(58) Field of Classification Search
  CPC .......... G01R 33/34076; G01R 33/3415; G01R 33/3628; G01R 33/422; G01R 33/3692; G01R 33/34046; G01R 33/3642; G01R 33/34; A61B 5/055
  See application file for complete search history.

(56) References Cited

U.S. PATENT DOCUMENTS

| 7,965,082 | B2 | 6/2011 | Greim et al. | |
| 2009/0096456 | A1* | 4/2009 | Biber | G01R 33/3692 |
| | | | | 324/322 |
| 2009/0256564 | A1* | 10/2009 | Greim | G01R 33/3642 |
| | | | | 324/309 |
| 2013/0069652 | A1* | 3/2013 | Otake | G01R 33/3664 |
| | | | | 324/322 |

FOREIGN PATENT DOCUMENTS

CN 101556313 B 8/2012

* cited by examiner

*Primary Examiner* — G. M. A Hyder

(74) *Attorney, Agent, or Firm* — Schiff Hardin LLP

(57) ABSTRACT

A radio-frequency system for a magnetic resonance apparatus has a local coil, a body coil, and an impedance adjusting shield. The body coil is wirelessly power-coupled with the local coil such that the body coil serves as a transmitting coil for radio-frequency signals and the local coil serves as a receiving coil for magnetic resonance signals. The local coil is disposed in an internal cavity of the impedance adjusting shield. An impedance of the local coil is adjusted by the impedance adjusting shield so as to match the impedance of the local coil and the body coil. The impedance adjusting shield has a frequency modulation element that adjusts the resonance frequency of the local coil. The body coil couples power to the local coil, and the impedance adjusting shield effectively reduces energy transmission efficiency loss caused by reflection, thereby improving energy transmission efficiency.

9 Claims, 7 Drawing Sheets

RADIO-FREQUENCY SYSTEM FOR A MAGNETIC RESONANCE APPARATUS

BACKGROUND OF THE INVENTION

Field of the Invention

The invention concerns the field of magnetic resonance imaging, in particular concerns a radio-frequency system for a magnetic resonance apparatus.

Description of the Prior Art

MRI (Magnetic Resonance Imaging) is a tomography modality that uses magnetic resonance to obtain electromagnetic signals from the human body and so as to reconstruct human body information therefrom. From magnetic resonance images, we can obtain many physical characteristic parameters of matter can be discerned, such as proton density, diffusion coefficient, magnetization coefficient and chemical shift. Compared with other imaging modalities (such as CT ultrasound and PET), magnetic resonance imaging methods are more diverse and the information obtained is more abundant. Therefore, magnetic resonance imaging has become a widely used, and the subject of development and research.

Providing a local radio-frequency (RF) emission function in an MRI system will bring about significant advantages. Specifically, it has the advantages of reducing the output power of the RF amplifier, and a low specific absorption rate (SAR). This technique is applied to magnetic resonance scanning of human body parts such as heads, shoulders and knees. For local radio-frequency emission functions, basic supporting equipment, such as connecting wires and change-over switches with local radio-frequency signal transmission coils, in addition to the local radio-frequency system itself must be provided to support the operation of the local radio-frequency coil during this application. In order to save costs, low-end products often do not provide local radio-frequency functions, so there are often no local radio-frequency coils in low-end products.

In addition, those skilled in the art are still investigating other local radio-frequency coil designs.

SUMMARY OF THE INVENTION

An object of the present invention is to provide a radio-frequency system that solves this technical problem in the prior art, so the transmission efficiency is improved by reducing reflection when performing energy transmission with local coils and body coils.

In an embodiment, the radio-frequency system in accordance with the invention has a local coil, a body coil, and an impedance adjusting shield. The local coil is an inductively coupled coil and is provided with a resonator. The body coil is wirelessly power-coupled with the local coil such that the body coil serves as a transmitting coil for radio-frequency signals and the local coil serves as a receiving coil for magnetic resonance signals. The impedance adjusting shield is provided with an internal cavity. The local coil is disposed in the internal cavity, such that an impedance of the local coil is adjusted by the impedance adjusting shield o as to match the impedance of the local coil and the body coil. In addition, the impedance adjusting shield is provided with a frequency modulation element with which the resonance frequency of the local coil is adjusted. After the impedance of the local coil and the body coil in the impedance adjusting shield can be better matched, the transmission loss of the body coil due to reflection can be reduced in the energy transmission process, and the energy transmission efficiency of the system is thereby improved.

In embodiment, the impedance adjusting shield has a hollow casing and a frequency modulation coil, and the hollow casing fits over the local coil. An outer wall of the hollow casting has at least one open window, and the open window connects the interior and the exterior of the hollow casing. The frequency modulation coil fits over the end of the hollow casing in which the open window is formed, and the open window is situated inside the frequency modulation coil. The frequency modulation element is situated on the frequency modulation coil. In this embodiment, the impedance adjusting shield has a specific structure, and the open window is provided on the impedance adjusting shield. The open window enables the system to obtain the required coupling coefficient K and to implement frequency compensation. The frequency modulation coil thus can compensate for the change of the body coil frequency.

In another embodiment, the hollow casing is cylindrical with one open end, the other end of the hollow casing is provided with the open window, and the frequency modulation coil fits over the other end coaxially. This embodiment provides a specific arrangement of the hollow casing and the frequency modulation coil. The local coil may be placed in the internal cavity of the hollow casing through the opening of the hollow casing.

In another embodiment, the frequency modulation coil is formed by two first annular coils positioned at two axial ends of the frequency modulation coil and coaxially arranged. The first annular coil is circumferentially provided with a number of the frequency modulation elements. The frequency modulation coil further has a number of first support coils. The first support coils are strip-shaped. The first support coils are circumferentially situated between the two first annular coils. Two ends of the first support coils are fixedly connected to the two first annular coils, respectively. The first support coils are provided with the frequency modulation elements. The frequency modulation elements arranged on the first annular coils are positioned between each two adjacent first support coils. In this embodiment, a specific structure of the frequency modulation coil and a specific arrangement of the frequency modulation element are provided.

In another embodiment, the frequency modulation element is a capacitor.

In another embodiment, the impedance adjusting shield is formed into a birdcage-shaped integral coil construction, the coil construction fits over the local coil, and the frequency modulation element is arranged on the coil construction. This embodiment provides another specific structure of the impedance adjusting shield. The impedance adjusting shield of this embodiment is also used to adjust the impedance of the local coil, thereby reducing transmission efficiency loss caused by reflection.

In another embodiment, the coil construction includes two second annular coils, and the two second annular coils are coaxially arranged at two ends of the coil construction. The second annular coil is circumferentially provided with a number of the frequency modulation elements. The coil construction further has a number of second support coils. The second support coils are strip-shaped and are circumferentially arranged between the two second annular coils. Two ends of the second support coils are fixedly connected to the two second annular coils, respectively. The second support coils are provided with the frequency modulation elements. The frequency modulation elements arranged on the second annular coils are provided between each two adjacent second support coils. In this embodiment, another specific implementation structure of the impedance adjusting shield is further disclosed.

In another embodiment, the impedance adjusting shield is made of copper. Generally speaking, the impedance adjusting shield can be made of a conductor or a semiconductor, but preferably, the energy transmission effect is better when copper is used.

The present invention also encompasses a magnetic resonance apparatus that includes the radio-frequency system as described in any of the above embodiments.

DESCRIPTION OF THE PREFERRED EMBODIMENTS

Figure 1:
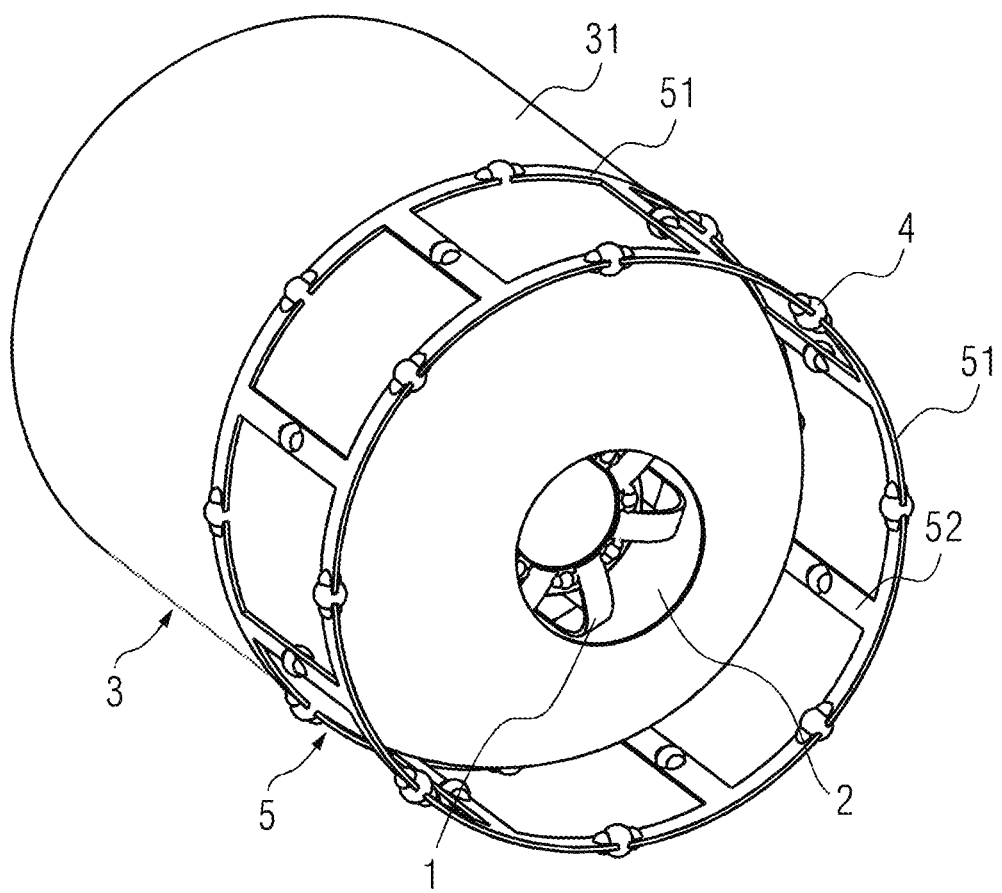
FIG. 1 schematically shows the structural relationship between a local coil and an impedance adjusting shield according to a first embodiment of the invention.

In order to have a clearer understanding of the technical features, objectives and effects of the invention, particular embodiments of the invention will now be described with reference to the accompanying drawings, in which like reference numerals refer to like parts. In the drawings showing various embodiments, the same last two digits indicate components with the same structure or similar structure but the same function.

In order to simplify the drawings, only the parts related to the invention are schematically shown in each drawing, and they do not represent the actual structure of the product. In addition, in order to make the drawings concise and easy to understand, in some drawings, only one of the components having the same structure or function is schematically shown or only one of them is marked.

The invention is based on the insight that a technique called inductive coupling can be used to solve the above-mentioned problem for magnetic resonance systems designed without a local radio-frequency function. The technique has been applied in the practical application of Siemens 1.5 T and 3.0 T limb coils. For specific technical details, refer to the patent document entitled "Radio-frequency Signal Processing Method and Radio-frequency System" (patent No. CN 101556313 B), which is focused on a method for processing radio-frequency signals between a body coil and a local coil 1 and a radio-frequency system.

For low-end systems, the body coil cannot be adjusted correspondingly for different loads. When loaded or unloaded, the body coil is a fixedly matched adjusting circuit. As the patient load has a great influence on the matching of the body coil in the 1.5 T and above equipment, the matching of the body coil with a heavy load enables the body coil to achieve optimal energy transmission under heavy load.

This also means, however, that the energy transmission of the body coil will be weakened for patients with a light load or under no load. In the patent of "Radio-frequency Signal Processing Method and Radio-frequency System", when a magnetic resonance system is used to scan light-load human body parts such as heads, shoulders and knees, an inductively coupled coil (i.e. the local coil 1 mentioned hereinafter) is used to improve and obtain energy transmission as good as under heavy load conditions. This method is feasible because the performance of the load process of small-sized human body parts, such as heads, shoulders and knees, is similar to the load process of large-sized objects such as the whole body of a patient, which is the optimal load condition for the body coil.

Assuming that a reflection coefficient of the body coil $s11=-0.7$ when no load is applied, after the inductively coupled coil is applied, the reflection coefficient of the body coil $s11=0$. Therefore, the normalized loss resistance caused by the body coil is 0.176 ohm and 1 ohm under no load and with load, respectively.

The specific calculation equation is:

unloaded normalized loss resistance=$(1+s11)/(1-s11)$
=$(1-0.7)/(1+0.7)=0.176$ ohms;

loaded normalized loss resistance=$(1+s11)/(1-s11)=(1+0)/(1-0)=1$ ohm; and useful power loss resistance that should be generated in the system=$1-0.176=0.824$ ohms. (The useful power loss resistance here refers to that, in the wireless power coupling between the local coil 1 and the body coil, some of the energy is transmitted to the local coil 1, and the remaining energy is lost due to factors such as reflection. The larger the proportion of power loss resistance corresponding to the energy transmitted to the local coil 1, the better the effect of wireless transmission. That is, the power loss resistance corresponding to the energy transmission of the local coil 1 is the useful power loss resistance.)

Transmission efficiency caused by body coil loss is:

$10*lg(1-0.176)=-0.84$ dB, which is acceptable. The reflection loss is $10*lg(1-0^2)=0$ dB.

If the noise resistance introduced into the body coil by the inductively coupled coil (i.e., the local coil 1) is very different from the load of the body coil matched under heavy load, then the technology of realizing the equivalence of load and heavy load through inductive coupling technology in "Radio-frequency Signal Processing Method and Radio-frequency System" will fail. Especially in the low field (<1 T), the patient's load does not have much influence on the load of the body coil. In addition, the loaded and unloaded quality factor (Q value) of the inductively coupled coil (i.e. the local coil 1) are quite high.

Figure 3:
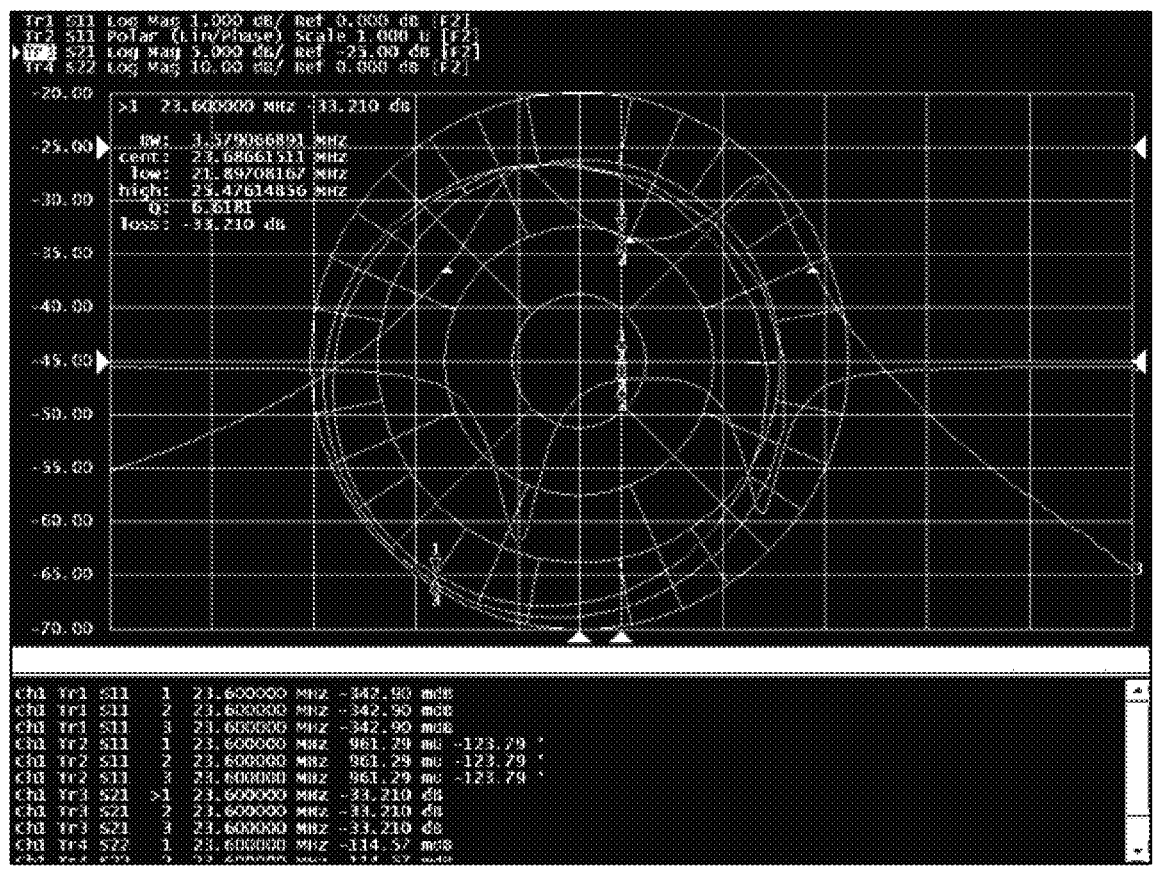
FIG. 3 is a screen shot of a prototype test result of a local coil coupled to a body coil according to the prior art.

FIG. 3 is a screen shot of a prototype test result of a local coil coupled to a body coil in the prior art that is relevant to the present invention. In the test, a large annular coil is used to simulate the body coil and a small annular coil is used to simulate the inductively coupled coil. As shown in FIG. 3, the resistance loss caused in the body coil is very large due to the strong coupling and the high Q value in the low frequency state. In the test, under the unloaded condition, the reflection coefficient of the body coil s11=−0.8; and under the loaded condition when loaded with the local coil 1, the reflection coefficient of the body coil s11=0.96. The loss resistance is 0.11 ohms and 49 ohms respectively in the two states.

According to the above calculation equation, the following can be deduced similarly:

loss resistance under unloaded condition=$(1+s11)/(1-s11)=(1-0.8)/(1+0.8)=0.11$ ohms;

loss resistance under loaded condition=$(1+s11)/(1-s11)=(1+0.96)/(1-0.96)=49$ ohms; and useful power loss resistance that should be generated in the system=$49-0.11=48.89$ ohms.

The reflection loss is $10*\lg(1-0.96^2)=-11.06$ dB.

The transmission loss caused by the loss of the body coil is therefore very low, and its specific value is:

$10*\lg[(49-0.11)/49]=-0.01$ dB

Moreover, a very strong reflection occurs at the body coil terminal due to strong coupling. The reflection coefficient of the body coil is 0.96, which is close to 1, so that the amplifier power will be almost totally reflected, and the corresponding transmission efficiency will be reduced by about 11 dB.

The reflection loss is $10*\lg(1-0.96^2)=-11.06$ dB.

The difference between the total transmission efficiency and that in the case of a directly coupled local coil 1 is 11.06 dB. In order to obtain better transmission efficiency, it is obvious that the reflection coefficient s11 under load should be optimized in order to obtain better transmission efficiency. As an example, s11 is assigned the value of 0.1 (instead of the original 0.96) and a simple calculation shows that the transmission efficiency of the minimum inductive coupling loss is as follows:

$10*\lg\{1-0.11/[(1+s11)/(1-s11)]\}+10*\lg(1-s11^2)=-0.45$ dB

This means that the coupling coefficient of the body coil and the local coil 1 must be adjusted in order to obtain the optimized adjustment parameters of the body coil.

In order to make the technical solution and advantages of the invention clearer, the invention will be described in further detail below with reference to the drawings and embodiments. It should be understood that the specific embodiments described herein are for illustrative purposes only and are not intended to limit the scope of protection of the invention.

Figure 2:
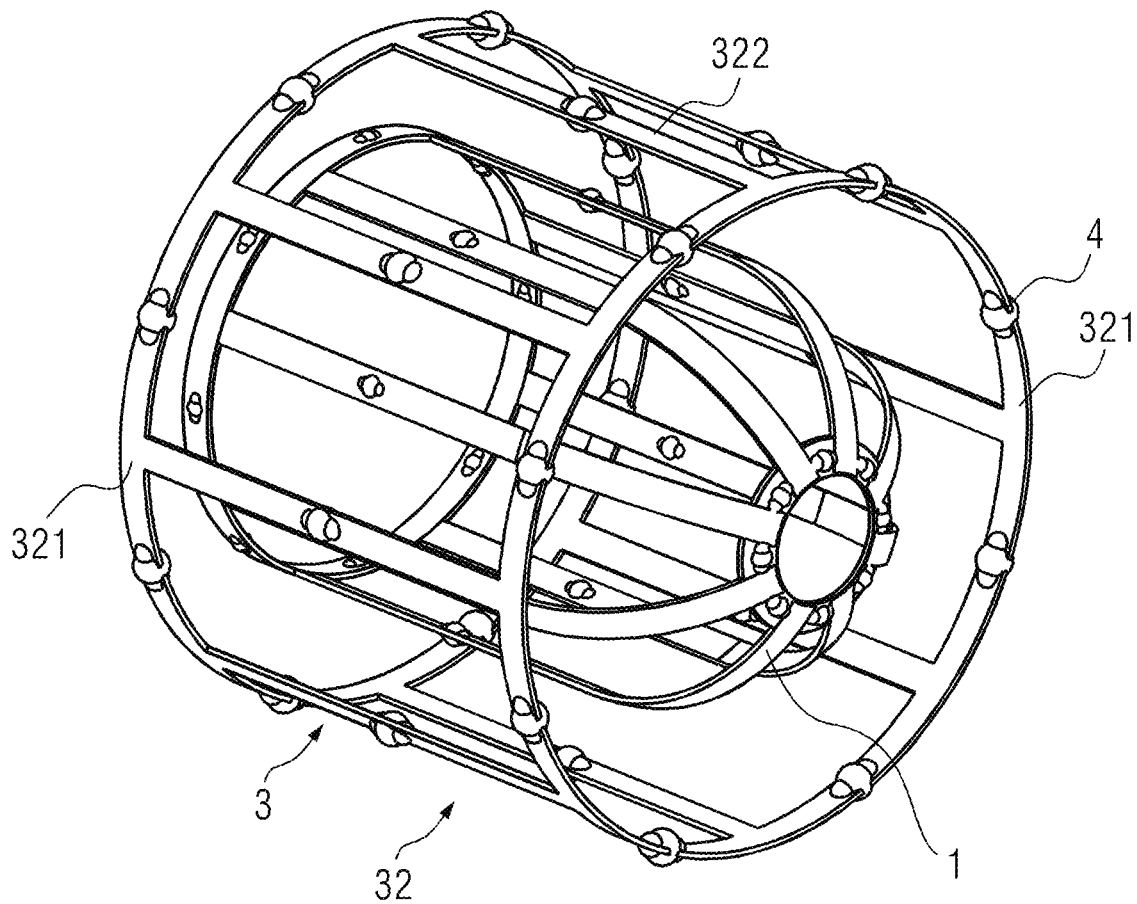
FIG. 2 schematically shows the structural relationship between a local coil and an impedance adjusting shield according to a second embodiment of the invention.

FIG. 1 is a schematic diagram showing the structural relationship between a local coil and an impedance adjusting shield according to a first embodiment of the invention. FIG. 2 is a schematic diagram of the structural relationship between a local coil and an impedance adjusting shield according to a second embodiment of the invention. As shown in FIGS. 1 and 2, an impedance adjusting shield 3 is provided outside the local coil 1 for reducing the coupling coefficient K which in turn affects the matching with the body coil reflection coefficients 11. The impedance adjusting shield 3 in FIG. 1 is only exemplary and is not intended to limit the specific structure of the impedance adjusting shield 3. For the impedance adjusting shield 3 in FIGS. 1 and 2, two different embodiments are respectively shown.

In an embodiment of the invention, the radio-frequency system has a local coil 1, a body coil and an impedance adjusting shield 3. The local coil 1 is an inductively coupled coil and is provided with a resonator. The body coil is wirelessly power-coupled with the local coil 1 in such a manner that the body coil serves as a transmitting coil for radio-frequency signals and the local coil 1 serves as a receiving coil for magnetic resonance signals. The impedance adjusting shield 3 fits over the local coil 1. The impedance adjusting shield 3 has an internal cavity in which the local coil 1 is disposed. The purpose of the impedance adjusting shield 3 is to adjust the impedance of the local coil 1 so that the impedance of the local coil 1 and the body coil match each other. It should be noted that in the prior art, especially in a low frequency state, the transmission efficiency between the local coil 1 and the body coil is too low due to impedance mismatch, and a large amount of energy is lost (this part of energy is the energy loss caused by reflection). Therefore, the impedance of the local coil 1 is adjusted by the impedance adjusting shield 3. In addition, on this basis, the impedance adjusting shield 3 is also provided with a frequency modulation element 4, and the resonance frequency of the local coil 1 is adjusted by the frequency modulation element 4. The degree of matching between the local coil 1 and the body coil is improved by arranging the impedance adjusting shield 3 outside the local coil 1, so that the system reflection can be reduced and the energy transmission efficiency thereby improved.

In another embodiment, when the impedance adjusting shield 3 is a hollow casing 31 (particularly referring to the specific case shown in FIG. 1), the hollow casing 31 fits over the local coil 1, and at least one open window 2 is provided in an outer wall of the hollow casing 31. Of course, the number of the open window 2 is not limited to one, and the open window 2 connects the inside and outside of the hollow casing 31. In the actual application process, although the influence of reflection on transmission efficiency can be effectively controlled by adding the impedance adjusting shield 3, coupling may be reduced too much. Therefore, the required coupling coefficient K is achieved by adjustment through the open window 2 provided on the impedance adjusting shield 3. In addition, the impedance adjusting shield 3 further includes at least one frequency modulation coil 5, and the frequency modulation coil 5 is disposed outside the impedance adjusting shield 3. The reason why the frequency modulation coil 5 is provided is that the frequency of the body coil is also changed while the impedance adjusting shield 3 is introduced to adjust the reflection, and in order to compensate for the frequency change generated by the body coil, an additional frequency modulation coil 5 is added to compensate for the frequency change of the body coil. Generally speaking, the frequency modulation coil 5 fits over the end of the hollow casing 31 in which the open window 2 is formed, and the open window 2 is arranged inside the frequency modulation coil 5. The frequency modulation element 4 is arranged on the frequency modulation coil 5. Of course, the frequency modulation coil 5 is only one component for compensating for the frequency change of the body coil, and other comments can be added to compensate for the frequency of the body coil. In this embodiment, the specific structure and position relationship between the impedance adjusting shield 3, the open window 2, and the frequency modulation coil 5 are provided.

In another embodiment, the hollow casing 31 is cylindrical with one open end, the other end of the hollow casing 31 is provided with the open window 2, and the frequency modulation coil 5 fits over the other end coaxially. In this embodiment, the specific structure of the hollow casing 31 is described in more detail. One end of the hollow casing 31 is open for placing the local coil 1 therein, and the other end provides a structural basis for disposing the frequency modulation coil 5.

In another embodiment, the frequency modulation coil 5 has two first annular coils 51. The two first annular coils 51 are positioned at two axial ends of the frequency modulation coil 5, and the two first annular coils 51 are coaxially arranged. The first annular coil 51 is circumferentially provided with a number of the frequency modulation elements 4. Further, the frequency modulation coil 5 also comprises a number of first support coils 52. The first support coils 52 are strip-shaped. The first support coils 52 are circumferentially arranged between the two first annular coils 51. Two ends of the first support coils 52 are fixedly connected to the two first annular coils 51, respectively. The first support coils 52 are provided with the frequency modulation elements 4. The frequency modulation elements 4 on the first annular coils 51 are positioned between every two adjacent first support coils 52. A specific structure of the frequency modulation coil 5 is provided in this embodiment. Of course, the frequency modulation coil 5 in this embodiment is schematic, and other coil structures may be used.

In another embodiment, the frequency modulation element 4 is a capacitor. A particular embodiment of the frequency modulation element 4 is provided. By adjusting the capacitance of the frequency modulation element 4, the characteristics of the frequency modulation coil 5 itself are changed so as to adjust the resonance frequency of the local coil 1.

As shown in FIG. 2, in another alternative embodiment, the impedance adjusting shield 3 is formed into a birdcage-shaped integral coil construction 32 (particularly, in the specific case shown in FIG. 2), the coil construction 32 fits over the local coil 1, and the frequency modulation element 4 is arranged on the coil construction 32. This embodiment provides another specific embodiment of the impedance adjusting shield 3, which is different from the first embodiment in that the impedance adjusting shield 3 itself is a coil. In this embodiment, the impedance adjusting shield 3 can adjust the impedance characteristics of the local coil 1 and can also adjust the resonance frequency of the local coil 1 through the frequency modulation element 4. Of course, in this embodiment, if the local coil 1 is a shoulder coil or a knee coil, the birdcage structure is no longer applicable, so the birdcage structure is an exemplary structure and is not intended to limit the structure of the coil construction 32.

In another alternative embodiment, the coil construction 32 includes two second annular coils 321, and the two second annular coils 321 are coaxially arranged at two ends of the coil construction 32. The second annular coil 321 is circumferentially provided with a number of frequency modulation elements 4. The coil construction 32 further comprises a number of second support coils 322. The second support coils 322 are strip-shaped. The second support coils 322 are circumferentially arranged between the two second annular coils 322. Two ends of the second support coils 322 are fixedly connected to the two second annular coils 321, respectively. The second support coils 322 are provided with the frequency modulation elements 4. The frequency modulation elements 4 on the second annular coils 321 are provided between each two adjacent second support coils 322. This embodiment provides a specific coil construction of the coil construction 32.

In another alternative embodiment, the impedance adjusting shield 3 is made of copper. Generally speaking, the impedance adjusting shield 3 can be made of a conductor or a semiconductor, but preferably, the transmission effect is better when copper is used.

The present invention also encompasses a magnetic resonance apparatus having the radio-frequency system as described in any of the embodiments described above.

Figure 4:
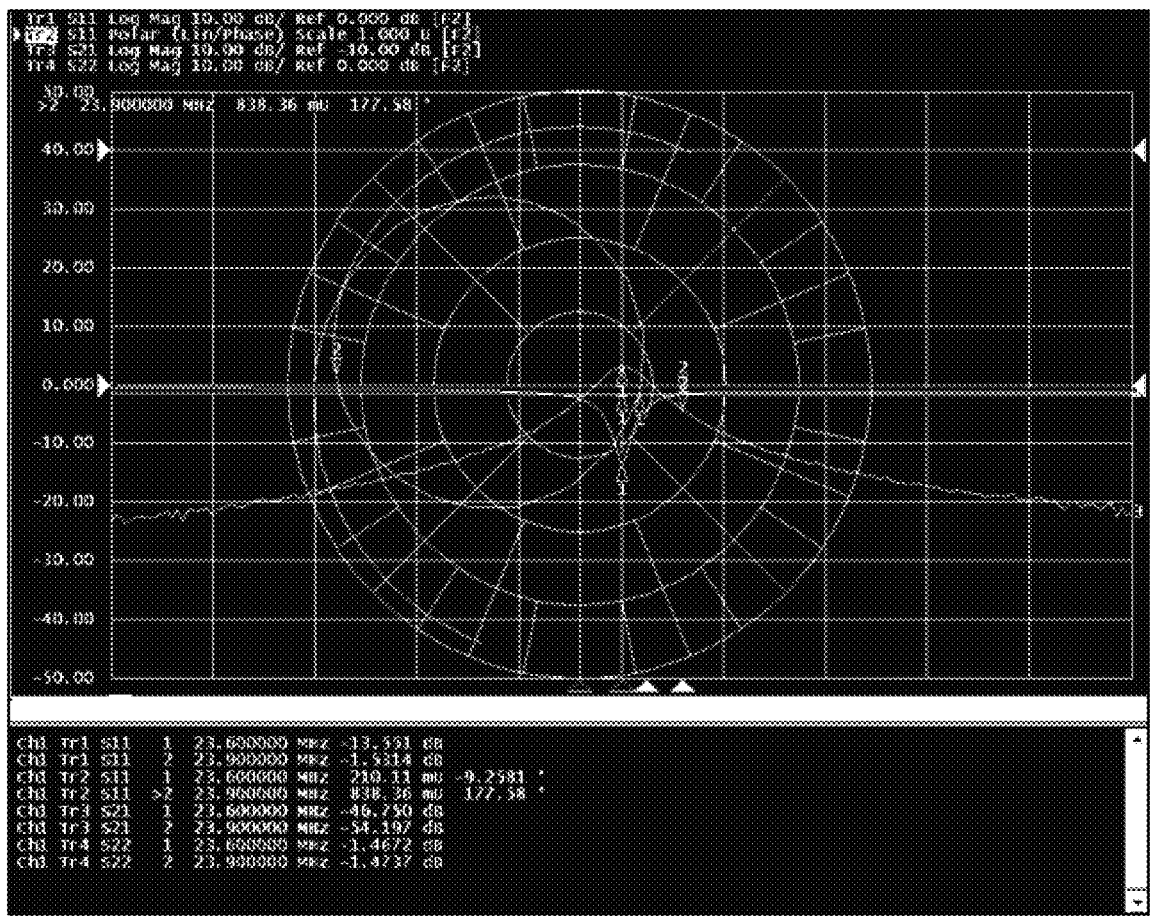
FIG. 4 is a screen shot of a prototype test result of the transmission efficiency of a body coil of the invention but in the context of the prior art.
Figure 5:
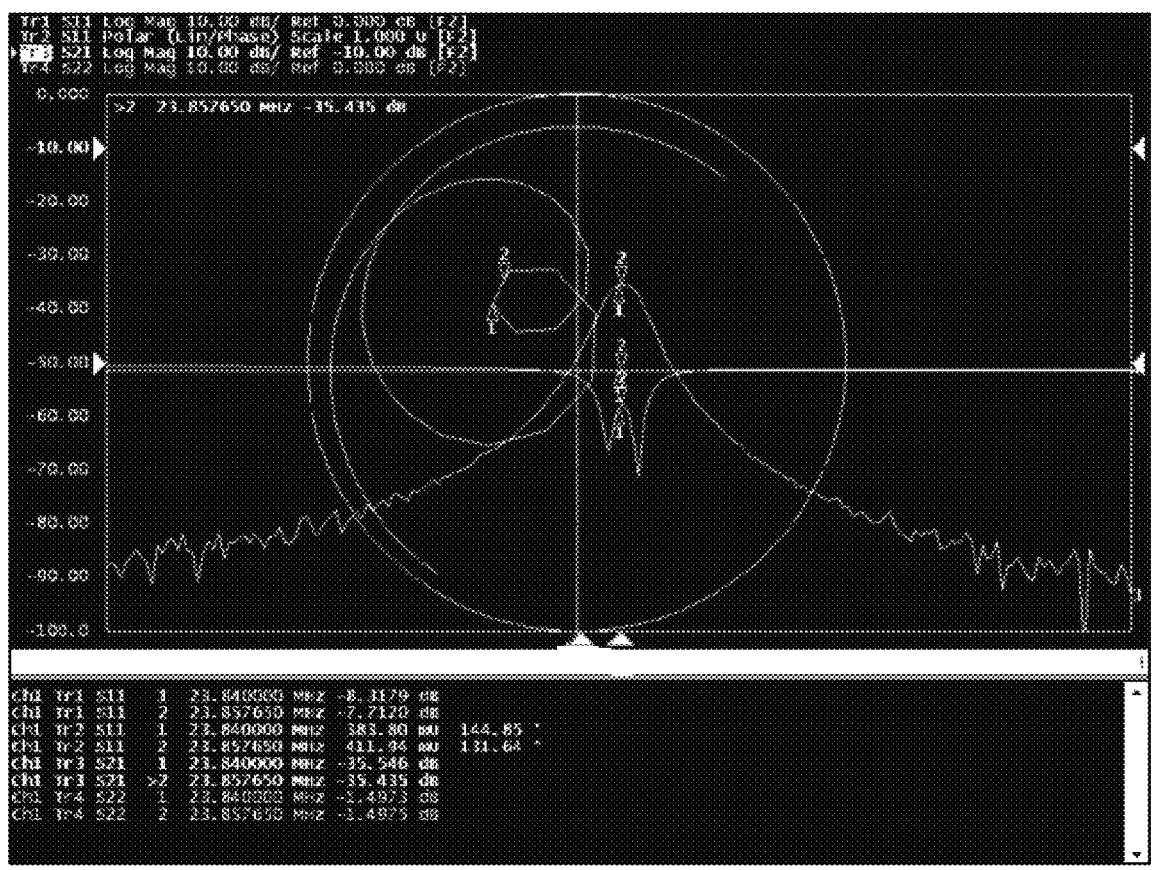
FIG. 5 is a screen shot of a prototype test result of transmission efficiency of a local coil with a hollow casing of the invention.
Figure 6:
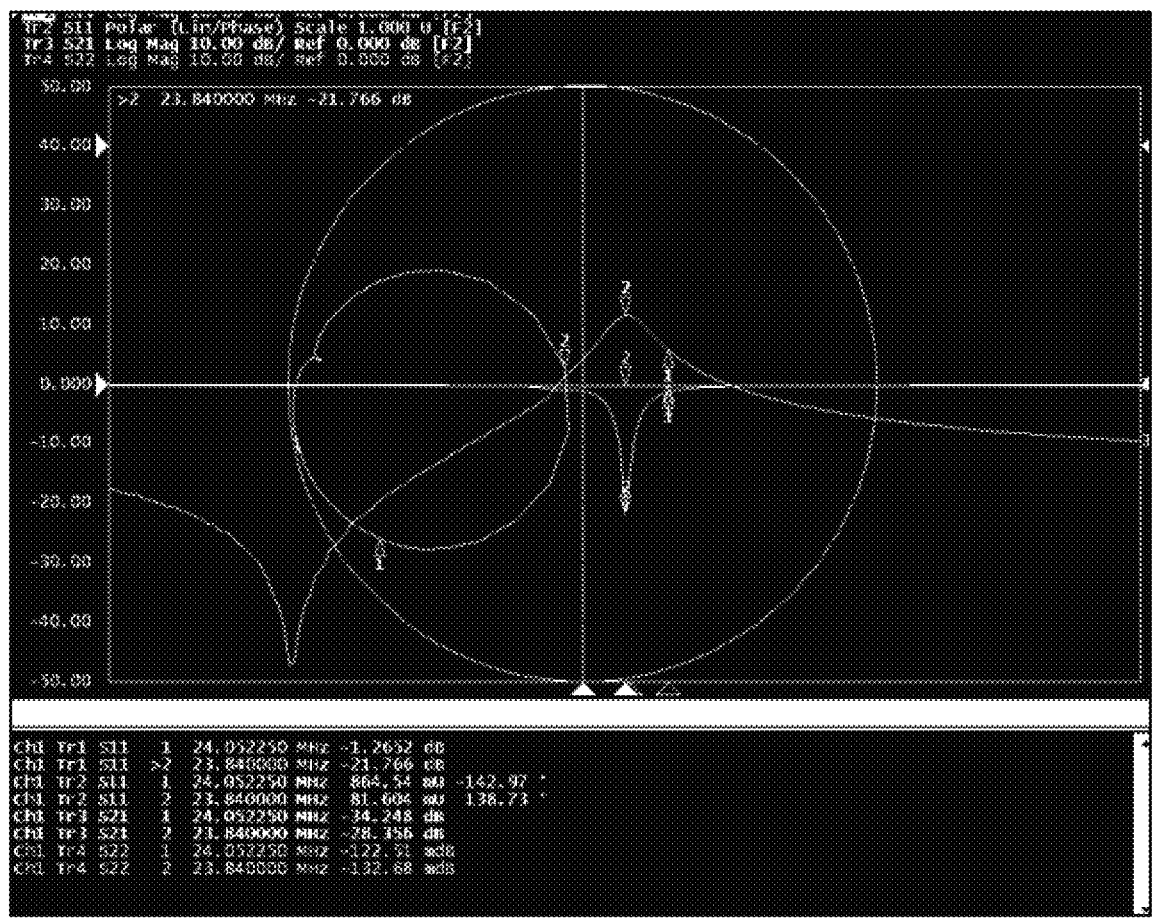
FIG. 6 is a screen shot of a prototype test result of transmission efficiency when the hollow casing is provided and the body coil and the local coil are connected via a connecting wire according to the invention.
Figure 7:
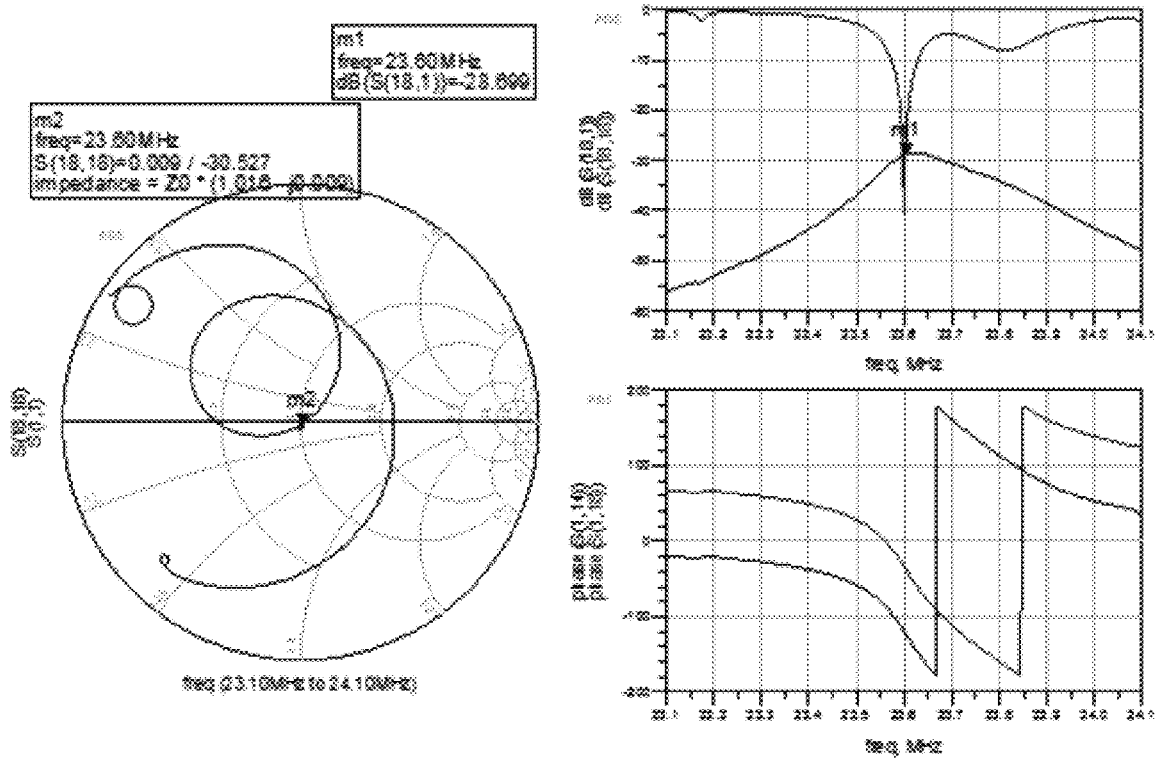
FIG. 7 is a screen shot of a simulation result of the local coil with a coil construction of the invention.

FIG. 4 is a screen shot of a prototype test result of transmission efficiency of a body coil of the invention in the context of the prior art. FIG. 5 is a screen shot of a prototype test result of transmission efficiency of a local coil with a hollow casing of the invention. FIG. 6 is a screen shot of a prototype test result of transmission efficiency when the hollow casing is provided and the body coil and the local coil are connected via a connecting wire according to the invention. FIG. 7 is a screen shot of a simulation result of the local coil with a coil construction of the invention. As shown in FIGS. 4 to 7, the effects of the improvement of the invention will be further explained and exemplified according to test results before and after the improvement.

As shown in FIG. 4, since the transmission efficiency of the body coil is very poor when the induction coil (i.e., the local coil 1) is not used, it is only about −46.8 dB (the data in the fourth line from the bottom in FIG. 4). As shown in FIG. 5, the transmission efficiency is increased to −35.4 dB (the data in the third line from the bottom in FIG. 5) after the induction coil (i.e., the local coil 1) and the impedance adjusting shield 3 are added, thus increasing by about 12 dB. As shown in FIG. 6, when the local coil 1 is directly connected to the body coil through a cable, the transmission efficiency of the local coil 1 is about −28.3 dB (data in the third line from the bottom in FIG. 6) under the same conditions as other test conditions. The reflection loss obtained with the reflection coefficient is:

$$10*lg(1-0.383^2)=-0.7 \text{ dB}$$

In addition, for the reflection coefficient s11=0.383 when the body coil is loaded and s11=−0.21 when the body coil is unloaded, the impedance when the body coil is unloaded can be obtained as 0.653 ohms according to the formula for calculating the impedance through the reflection coefficient in the foregoing. Therefore, the loss of transmission power caused by the impedance of the body coil is:

$$10*lg\{1-0.653/[(1+s11)/(1-s11)]\}=-1.5 \text{ dB}$$

Together with the 3 dB transmission efficiency loss of a 90° mixer added in the body coil to form circular polarization, the obtained maximum transmission efficiency is about:

$$-28.3 \text{ dB}-3 \text{ dB}-1.5 \text{ dB}-0.7 \text{ dB}=-33.4 \text{ dB}$$

There is still a difference of about 1 dB from the test data −35.4 of FIG. 5, which is probably due to the loss caused by the impedance of the connecting wire and additional switch. It can be seen from this that the improved body coil and the local coil 1 have basically the same effect on energy transmission as using the local coil connection wire, and the reflection loss is greatly reduced.

As shown in FIGS. 2 and 7, the application also provides an alternative embodiment, i.e. the impedance adjusting shield 3 takes the structure of a coil construction 32. The coil construction 32 mentioned above is equivalent to the impedance adjusting shield 3 and the frequency modulation coil 5 in the first embodiment. The reduction of the coupling coefficient K will be obtained by the resonance frequency of the local coil 1, where the frequency will be greater than the frequency of magnetic resonance. The coil construction 32 compensates for the frequency change of the body coil by making the resonance frequency lower than the magnetic resonance frequency. As shown in FIG. 7, it is shown that the results of the two embodiments are the same (the transmission efficiency in box m1 in FIG. 7 is −28.699).

For the embodiment of the coil construction 32, the structure is simpler compared to the technical solution of the hollow casing 31 and the frequency modulation coil 5. As shown in FIG. 7, the acquired transmission efficiency is not changed and the structure is more compact. The disadvantage is that the frequency response is asymmetric and the bandwidth of the frequency is limited.

The coupling coefficient K is adjusted by changing the number and size of the open window 2. The purpose of adjusting the coupling coefficient K is to obtain the best transmission efficiency between the body coil and the local coil 1. The coupling coefficient K affects the coupling of the local coil 1 and the body coil and the matching of the body coil. The coupling coefficient K thus improves the transmission of energy between the coupled local coil 1 and body coil. If the coupling coefficient K is too high, the matching of the body coil will be compromised. The selection principle of the coupling coefficient K is that it is desirable to maximize the energy transmission efficiency from body coil to local coil 1. In addition, taking into account the impedance loss and the reflection loss when the body coil is unloaded, the coupling coefficient K is generally higher than the matching value of the body coil.

The specific beneficial effects of this application are summarized as follows.

The loss of energy transmission efficiency due to reflection is reduced by adding the impedance adjusting shield 3. The coupling coefficient K between the local coil 1 and the body coil is optimized by the open window 2 so as to optimize the transmission efficiency. The frequency modulation coil 5 compensates for the frequency change of the body coil.

In addition, this application also provides another embodiment of the impedance adjusting shield 3. The coil construction 32 is used to replace the hollow casing 31 and the frequency modulation coil 5 in the first embodiment. It is also possible to achieve the same purpose of reducing the loss of energy transmission efficiency and compensating for the change of the body coil frequency.

Herein, "schematic" means "serving as an example, instance, or illustration", and any drawings or embodiments described herein as "schematic" should not be interpreted as a more preferred or advantageous technical solution.

It should be understood that although this description is provided according to various embodiments, each embodiment contains not only one independent technical solution. This description is provided just for clarity. Those skilled in the art should take the description as a whole, and the technical solutions in various embodiments can also be appropriately combined to form other embodiments that can be understood by those skilled in the art The detailed description above is only specific description of feasible embodiments of the invention, and is not intended to limit the scope of protection of the invention, and all equivalent embodiments or modifications that do not depart from the technical spirit of the invention should be included in the scope of protection of the invention.

The invention claimed is:

1. A radio-frequency (RF) system comprising:
   a local RF coil comprising an inductively coupled coil and a resonator;
   a body RF coil wirelessly power-coupled with said local RF coil in order for said body RF coil to serve as a transmitting coil for RF signals, and in order for said local coil to serve as a receiving coil for magnetic resonance signals resulting from said RF signals; and
   an impedance adjusting shield comprising an internal cavity and a frequency modulation element, said local RF coil being disposed in said internal cavity with an impedance of the local coil being adjusted by the impedance adjusting shield so as to match the impedance of the local RF coil and an impedance of the body RF coil, and with a resonance frequency of said local RF coil being adjusted by said frequency modulation element.

2. An RF system as claimed in claim 1 wherein said impedance adjusting shield comprises:
   a hollow casing that fits over said local RF coil, said hollow casing having an open window at one end of said hollow casing, said open window connecting an interior of said hollow casing with an exterior of said hollow casing; and
   a frequency modulation coil that fits over the end of the hollow casing at which said open window is situated, said open window being inside said frequency modulation coil, and said frequency modulation element being situated on said frequency modulation coil.

3. An RF system as claimed in claim 2 wherein said hollow casing is cylindrical with one open end, with the other end of said hollow casing being said end at which said open window is formed, with said frequency modulation coil coaxially fitting over said other end of said hollow casing.

4. An RF system as claimed in claim 3 wherein said frequency modulation coil comprises:
   two annular coils coaxially positioned respective at two axial ends of said frequency modulation coil;
   each annular coil having a circumference at which a plurality of frequency modulation elements are situated; and
   said frequency modulation coil comprising a plurality of support coils, said support coils each being stripped-shaped and being circumferentially situated between said two annular coils, with two ends of said coils being fixedly connected to said two annular coils, respectively, said support coils each comprising said frequency modulation elements with said frequency modulation elements being situated on said annular coils and positioned between each two adjacent support coils.

5. An RF system as claimed in claim 1 wherein said frequency modulation element is a capacitor.

6. An RF system as claimed in claim 1 wherein said impedance adjusting shield has a birdcage coil structure, said birdcage coil structure fitting over said local RF coil, and said frequency modulation element being situated in said birdcage coil structure.

7. An RF system as claimed in claim 6 wherein said birdcage coil construction comprises:
   two annular coils coaxially situated at two axial ends of said birdcage coil structure, each annular coil having a circumference at which a plurality of said frequency modulation elements are situated; and
   a plurality of support coils, said support coils each being stripped-shaped and being circumferentially situated between said annular coils, said ends of said support coils being fixedly connected to said two annular coils, respectively, and said support coils comprising said frequency modulation elements, with the frequency modulation elements situated on the annular coils between each two adjacent support coils.

8. An RF system as claimed in claim 1 wherein said impedance adjusting shield is comprised of copper.

9. A magnetic resonance (MR) apparatus comprising:
- an MR data acquisition scanner;
- a radio-frequency (RF) system disposed in said MR data acquisition scanner; and
- said RF system comprising a local RF coil comprising an inductively coupled coil and a resonator, a body RF coil wirelessly power-coupled with said local RF coil in order for said body RF coil to serve as a transmitting coil for RF signals, and in order for said local coil to serve as a receiving coil for magnetic resonance signals resulting from said RF signals, and an impedance adjusting shield comprising an internal cavity and a frequency modulation element, said local RF coil being disposed in said internal cavity with an impedance of the local coil being adjusted by the impedance adjusting shield so as to match the impedance of the local RF coil and an impedance of the body RF coil, and with a resonance frequency of said local RF coil being adjusted by said frequency modulation element.

\* \* \* \* \*